United States Patent
Pi et al.

(10) Patent No.: US 8,847,692 B2
(45) Date of Patent: Sep. 30, 2014

(54) OSCILLATORS AND METHOD OF OPERATING THE SAME

(75) Inventors: Ung-hwan Pi, Seoul (KR); Sun-ae Seo, Hwaseong-si (KR); Kee-won Kim, Suwon-si (KR); In-jun Hwang, Hwaseong-si (KR); Kwang-seok Kim, Seongnam-si (KR); Sung-chul Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 13/174,932

(22) Filed: Jul. 1, 2011

(65) Prior Publication Data
US 2012/0049966 A1   Mar. 1, 2012

(30) Foreign Application Priority Data
Aug. 25, 2010   (KR) .................. 10-2010-0082636

(51) Int. Cl.
*H03B 15/00* (2006.01)
(52) U.S. Cl.
CPC .................... *H03B 15/006* (2013.01)
USPC .............................................. 331/94.1; 331/3
(58) Field of Classification Search
USPC .................................................... 331/94.1, 3
See application file for complete search history.

(56) References Cited

U.S. PATENT DOCUMENTS

| | | | |
|---|---|---|---|
| 6,560,077 B2 | 5/2003 | Fujiwara et al. | |
| 7,054,119 B2 | 5/2006 | Sharma et al. | |
| 7,057,921 B2 | 6/2006 | Valet | |
| 7,088,609 B2 | 8/2006 | Valet | |
| 7,161,829 B2 | 1/2007 | Huai et al. | |
| 7,440,314 B2 | 10/2008 | Sakimura et al. | |
| 7,466,526 B2 | 12/2008 | Sato et al. | |
| 7,504,898 B2 | 3/2009 | Fukuzawa et al. | |
| 7,589,600 B2 | 9/2009 | Dimitrov et al. | |
| 7,610,674 B2 | 11/2009 | Zhang et al. | |
| 7,616,412 B2 * | 11/2009 | Zhu et al. | 360/324.2 |
| 7,732,881 B2 | 6/2010 | Wang | |
| 7,764,538 B2 | 7/2010 | Ito | |
| 7,994,865 B1 | 8/2011 | Manstretta et al. | |
| 2002/0054461 A1 | 5/2002 | Fujiwara et al. | |
| 2004/0257717 A1 | 12/2004 | Sharma et al. | |
| 2005/0063222 A1 | 3/2005 | Huai et al. | |
| 2005/0254286 A1 | 11/2005 | Valet | |

(Continued)

FOREIGN PATENT DOCUMENTS

| | | |
|---|---|---|
| JP | 2006-319259 | 11/2006 |
| JP | 2007-305629 | 11/2007 |

(Continued)

OTHER PUBLICATIONS

Office Action dated Oct. 16, 2012 issued in co-pending U.S. Appl. No. 13/064,627.

(Continued)

*Primary Examiner* — Joseph Chang

(74) *Attorney, Agent, or Firm* — Harness, Dickey & Pierce, P.L.C.

(57) ABSTRACT

Oscillators and method of operating the same are provided, the oscillators include a magnetic layer, and a magnetization fixing element configured to fix a magnetization direction of the magnetic layer. The oscillators generate a signal by using precession of a magnetic moment of the magnetic layer.

16 Claims, 5 Drawing Sheets

(56) References Cited

U.S. PATENT DOCUMENTS

| | | |
|---|---|---|
| 2005/0254287 A1 | 11/2005 | Valet |
| 2006/0256484 A1 | 11/2006 | Sato et al. |
| 2007/0047294 A1 | 3/2007 | Panchula |
| 2007/0109147 A1 | 5/2007 | Fukuzawa et al. |
| 2007/0188936 A1 | 8/2007 | Zhang et al. |
| 2007/0259209 A1 | 11/2007 | Slavin et al. |
| 2008/0019040 A1 | 1/2008 | Zhu et al. |
| 2008/0074806 A1 | 3/2008 | Sato et al. |
| 2008/0150640 A1 | 6/2008 | Dimitrov et al. |
| 2008/0150643 A1 | 6/2008 | Suzuki et al. |
| 2008/0241597 A1 | 10/2008 | Dieny et al. |
| 2009/0050991 A1 | 2/2009 | Nagai et al. |
| 2009/0080106 A1 | 3/2009 | Shimizu et al. |
| 2009/0097169 A1 | 4/2009 | Sato et al. |
| 2009/0097170 A1 | 4/2009 | Sato et al. |
| 2009/0168501 A1 | 7/2009 | Ito |
| 2009/0201614 A1 | 8/2009 | Kudo et al. |
| 2009/0244792 A1 | 10/2009 | Nakayama et al. |
| 2009/0302953 A1 | 12/2009 | Xi et al. |
| 2009/0303779 A1 | 12/2009 | Chen et al. |
| 2010/0039105 A1 | 2/2010 | Ryan et al. |
| 2010/0039181 A1 | 2/2010 | Firastrau et al. |
| 2010/0103730 A1 | 4/2010 | Shin |
| 2010/0308923 A1 | 12/2010 | Kaka |
| 2011/0260270 A1 | 10/2011 | Zhang et al. |
| 2011/0280340 A1* | 11/2011 | Pasanen et al. ............... 375/300 |
| 2012/0038428 A1 | 2/2012 | Lee et al. |

FOREIGN PATENT DOCUMENTS

| | | |
|---|---|---|
| JP | 2008-053915 A | 3/2008 |
| JP | 2008-084879 A | 4/2008 |
| JP | 2009-094226 | 4/2009 |
| JP | 2009-099741 | 5/2009 |
| JP | 2009-135471 A | 6/2009 |
| JP | 2009-277704 | 11/2009 |
| KR | 2004-0055384 | 6/2004 |
| KR | 10-0697779 | 3/2007 |
| KR | 10-0827497 | 5/2008 |
| KR | 10-0866973 | 11/2008 |
| KR | 2009-0011247 | 2/2009 |
| KR | 2009-0031819 | 3/2009 |
| KR | 2009-0044575 | 5/2009 |
| KR | 2009-0071404 | 7/2009 |
| KR | 2009-0087825 | 8/2009 |
| KR | 2009-0102676 | 9/2009 |
| KR | 2009-0119253 | 11/2009 |

OTHER PUBLICATIONS

Office Action for corresponding U.S. Appl. No. 12/929,388 dated Mar. 28, 2012.

Office Action for corresponding U.S. Appl. No. 12/929,932 dated Apr. 24, 2012.

Office Action for corresponding U.S. Appl. No. 13/099,684 dated May 3, 2012.

Yoshida, et al.; "Unipolar resistive switching in CoFeB/MgO/CoFeB magnetic tunnel junction," *Applied Physics Letters*, vol. 92, pp. 113508-1-113508-3 (2008).

Houssameddine, et al.; "Spin transfer induced coherent microwave emission with large power from nanoscale MgO tunnel junctions," *Applied Physics Letters*, vol. 93, pp. 022505-1-022505-3 (2008).

Dimitrov, et al.; "Dielectric breakdown of MgO magnetic tunnel junctions," *Applied Physics Letters*, vol. 94, pp. 123110-1-113110-3 (Mar. 26, 2009).

Kiselev, et al.; "Microwave oscillations of a nanomagnet driven by a spin-polarized current," *Nature*, vol. 425, pp. 380-383 (Sep. 25, 2003).

Kaka, et al., "Mutual phase-locking of microwave spin torque nano-oscillators," *Nature*, vol. 427, pp. 389-392 (Sep. 15, 2005).

Deac, et al., "Bias-driven high-power microwave emission from MgO-based tunnel magnetoresistance devices," *Nature Physics*, vol. 4, pp. 803-809 (Aug. 10, 2008).

Georges, et al., "Origin of the spectral linewidth in nonlinear spin-transfer oscillators based on MgO tunnel junctions," *Physical Review*, vol. 80, pp. 060404-1-060404-4 (Aug. 31, 2009).

Rippard, et al., "Direct-Current Induced Dynamics in $Co_{90}Fe_{10}/Ni_{80}Fe_{20}$ Point Contacts," *Physical Review Letters*, vol. 92, No. 2, pp. 027201-1-027201-4 (Jan. 16, 2004).

Kent, *A Nanomagnet Oscillator*, Nature Publishing Group, vol. 6, 11. 399-400 (Jun. 2007).

Office Action dated Aug. 22, 2012 for U.S. Appl. No. 13/099,684.

Office Action dated Sep. 5, 2012 for U.S. Appl. No. 13/096,627.

* cited by examiner

OSCILLATORS AND METHOD OF OPERATING THE SAME

CROSS-REFERENCE TO RELATED APPLICATION

This application claims priority under 35 U.S.C. §119 from Korean Patent Application No. 10-2010-0082636, filed on Aug. 25, 2010, in the Korean Intellectual Property Office, the disclosure of which is incorporated herein in its entirety by reference.

BACKGROUND

1. Field

Example embodiments relate to oscillators and method of operating the same.

2. Description of the Related Art

Oscillators generate signals in regular periods and are mainly used in wireless communication systems (e.g., mobile communication terminals, satellite and radar communication devices, wireless network devices and automobile communication devices) in addition to analog sound synthesizers.

Main factors of an oscillator may include a quality factor, output power and phase noise. Performance of the oscillator may improve greatly as a quality factor and output power increases, and phase noise decreases. As communication devices are required to have high performance and to be minimized, and as an operational frequency band increases, there is a demand for the development of a small oscillator having a high quality factor, low phase noise and high output power.

In this regard, spin torque oscillators using a spin transfer torque phenomenon have been introduced. The spin torque oscillators may be manufactured to be significantly smaller than general inductor and capacitor (LC) oscillators and film bulk acoustic resonator (FBAR) oscillators, and have relatively high quality factor. Thus, the spin torque oscillators have drawn attention as next generation oscillators.

However, general spin torque oscillators need a large magnetic field for high frequency oscillation. For example, in order to generate a frequency of about 10 GHz, a magnetic field of about 1000 oersted (Oe) (i.e., 0.1 tesla (T)) should be applied to general spin torque oscillators. However, it is actually difficult to supply such a large magnetic field.

SUMMARY

Example embodiments relate to oscillators and method of operating the same.

Provided are oscillators using a spin transfer torque phenomenon. The oscillators generate high frequency signals without applying an external magnetic field thereto. Provided are methods of operating the oscillators.

Additional aspects will be set forth in part in the description which follow as and, in part, will be apparent from the description, or may be learned by practice of the presented embodiments.

According to example embodiments, an oscillator includes a magnetic layer, and a magnetization fixing element configured to fix a magnetization direction of the magnetic layer, wherein the oscillator is configured to generate a signal by using precession of a magnetic moment of the magnetic layer. The magnetic layer may be formed of (or include) a ferromagnetic material. The magnetic layer may be a ferromagnetic layer.

The magnetization fixing element and the magnetic layer may form a synthetic antiferromagnet (SAF) structure. In this case, the magnetization fixing element may include a first separation layer, a first fixed layer and a first antiferromagnetic layer that are sequentially formed in this order on a surface of the magnetic layer.

The magnetization fixing element may include an antiferromagnetic layer disposed on a surface of the magnetic layer.

A spin transfer torque for the precession may be induced from (or by) the magnetization fixing element. A spin transfer torque for the precession may be induced from (or by) a separate spin transfer magnetic element.

The magnetization fixing element may be disposed on a first surface of the magnetic layer, and the spin transfer magnetic element may include a second separation layer, a second fixed layer and a second antiferromagnetic layer that are sequentially formed in this order on a second surface of the magnetic layer. Here, the second fixing layer may be magnetized in a direction that is different from the magnetization direction of the magnetic layer.

When the magnetization fixing element includes a first separation layer, the second separation layer may be formed of a material that is different from the material of the first separation layer.

The second separation layer may include an insulating layer or a conductive layer.

An exchange coupling constant between the magnetic layer and the magnetization fixing element may be smaller than an exchange coupling constant between the second fixed layer and the second antiferromagnetic layer. An oscillation frequency may be adjusted according to the exchange coupling constant between the magnetic layer and the magnetization fixing element.

According to example embodiments, a method of operating an oscillator including a magnetic layer and a magnetization fixing element configured to fix a magnetization direction of the magnetic layer is provided. The method includes inducing a precession of a magnetic moment of the magnetic layer, and detecting a resistance change of the oscillator due to the precession.

Inducing the precession may include applying a current to the oscillator. The magnetic layer may be formed of (or include) a ferromagnetic material. The magnetic layer may be a ferromagnetic layer.

The magnetization fixing element and the magnetic layer may form a synthetic antiferromagnet (SAF) structure.

The magnetization fixing element may include an antiferromagnetic layer formed on a surface of the magnetic layer.

The oscillator may further include a spin transfer magnetic element configured to apply a spin transfer torque to the magnetic layer. In this case, inducing the precession may include applying a current to the spin transfer magnetic element from the magnetic layer.

The magnetization fixing element may be disposed on a first surface of the magnetic layer, and the spin transfer magnetic element may include a second separation layer, a second fixed layer, and a second antiferromagnetic layer that are sequentially formed in this order on a second surface of the magnetic layer. Here, the second fixing layer may be magnetized in a direction that is different from the magnetization direction of the magnetic layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
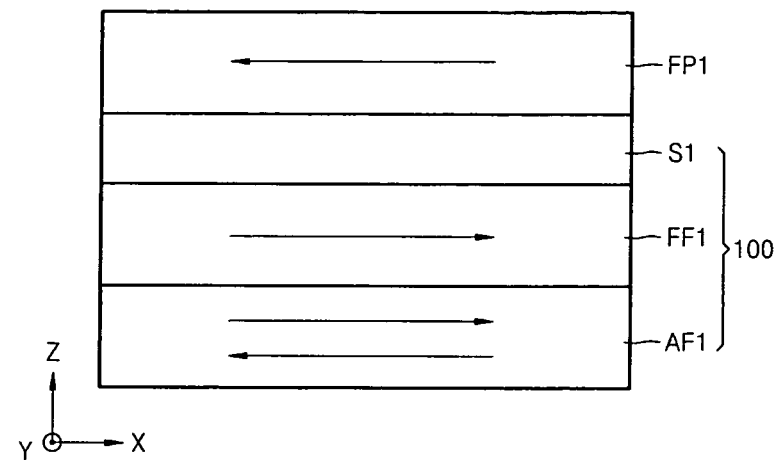
FIG. 1 is a cross-sectional view of an oscillator, according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Example embodiments relate to oscillators and method of operating the same.

FIG. 1 is a cross-sectional view of an oscillator, according to example embodiments.

Referring to FIG. 1, a "magnetization fixing element 100" configured to fix a magnetization direction of a magnetic layer FP1 may be disposed on a surface (e.g., a lower surface) of the magnetic layer FP1. The magnetic layer FP1 may be formed of (or include) a ferromagnetic material including at least one of Co, Fe, Ni and a combination thereof. The ferromagnetic material may further include other elements in addition to Co, Fe and Ni. For example, the ferromagnetic material may also further include other elements (e.g., boron (B), chromium (Cr), platinum (Pt), palladium (Pd), terbium (Tb), gadolinium (Gd) and the like) than Co, Fe, and Ni. For example, the magnetic layer FP1 may be formed of Fe, CoFe, CoFeB, NiFe, CoFePt, CoFePd, CoFeCr, CoFeTb, CoFeGd or CoFeNi.

The magnetization fixing element 100 may include a separation layer S1, a fixed layer FF1, and an antiferromagnetic layer AF1 that are sequentially formed in this order on the lower surface of the magnetic layer FP1, for example. A magnetization direction of the fixed layer FF1 may be fixed in a set direction by the antiferromagnetic layer AF1, and a magnetization direction of the magnetic layer FP1 may be fixed to be opposite to the magnetization direction of the fixed layer FF1. More specifically, the antiferromagnetic layer AF1 has characteristics in which magnetic moments of atoms are regularly arranged in a positive direction and a reverse direction, and the magnetization direction of the fixed layer FF1 may be fixed in the direction of the magnetic moment of the uppermost portion of the antiferromagnetic layer AF1 that is adjacent to the fixed layer FF1. As illustrated in the drawing, when a magnetic moment of the uppermost portion of the antiferromagnetic layer AF1 is in an x-axis direction, a magnetization direction of the fixed layer FF1 may be fixed in the x-axis direction. A magnetization direction of the magnetic layer FP1, which is spaced apart from the fixed layer FF1 with the separation layer 51 disposed therebetween, may be fixed to be opposite to the magnetization direction of the fixed layer FF1 due to exchange coupling between the fixed layer FF1 and the magnetic layer FP1. The magnetization direction of the magnetic layer FP1 may be fixed to be opposite to the magnetization direction of the fixed layer FF1 when a forming material and thickness of the separation layer 51 satisfy a set condition. In this case, the magnetic layer FP1 and the fixed layer FF1 may constitute a synthetic antiferromagnet (SAF) structure with the separation layer S1 disposed therebetween. In other words, the magnetic layer FP1 and the magnetization fixing element 100 may constitute a SAF structure.

The antiferromagnetic layer AF1 may include, for example, a manganese (Mn)-based material. The Mn-based material may include indium manganese (InMn) or iron manganese (FeMn). However, a material for forming the antiferromagnetic layer AF1 is not limited to the Mn-based material. A material for forming the antiferromagnetic layer AF1 may include any material having an antiferromagnetic characteristic. The fixed layer FF1 may include a ferromagnetic material including, for example, at least one of the Co, Fe, Ni and a combination thereof. The ferromagnetic material may further include other elements in addition to the Co, Fe and Ni. More specifically, the fixed layer FF1 may include Fe, CoFe, CoFeB and/or NiFe. A forming material of the fixed layer FF1 may be the same as the magnetic layer FP1, or may be different from the magnetic layer FP1. The separation layer 51 may be a layer formed of a conductive material (e.g., ruthenium (Ru) or chromium (Cr)). The separation layer 51 may be a conductive layer. A thickness of the separation layer 51 may be less than a few nm, for example, in the range of about 0.5 to about 1.0 nm.

The oscillator according to example embodiments may generate a signal in a specific frequency band by using precession of a magnetic moment of the magnetic layer FP1. The precession of a magnetic moment means that an axis of the magnetic moment is rotated while drawing a given orbit. Here, an axis direction of the magnetic moment may be the same as the magnetization direction. Accordingly, the precession of a magnetic moment may correspond to a rotation of the magnetization direction. As a magnetic moment of the magnetic layer FP1 is precessed, electrical resistance between the fixed layer FF1 and the magnetic layer FP1 may be periodically changed, and thereby a signal in a given frequency band may be oscillated.

In example embodiments, the fixed layer FF1 fixes the magnetization direction of the magnetic layer FP1. Fixing of the magnetization direction may have the same effect as applying an external magnetic field for the precession. Accordingly, in the oscillator according to example embodiments, the magnetic moment of the magnetic layer FP1 may be precessed only by a current without applying an external magnetic field. In general, a current-induced spin transfer torque for perturbation of a magnetic moment and an external magnetic field for providing a restoring force of a magnetic moment are required for precession of a magnetic moment. When a force for perturbation of a magnetic moment and a force to restore the magnetic moment to a set position are balanced, an axis of a magnetic moment may rotate while orbiting. As the restoring force increases, a rotating speed of a magnetic moment may increase, and consequently, oscillation frequency may increase. In a general oscillator, a magnetic layer of which magnetization direction is not fixed (i.e., a free layer) is used. Thus, in order to precess a magnetic moment of the free layer, a magnetic field that provides the restoring force may be applied. That is, an external magnetic field is required to fix a magnetization direction of the free layer to one side. However, in example embodiments, a magnetization direction of the magnetic layer FP1 is fixed by the magnetization fixing element 100 and thus a restoring force of a magnetic moment of the magnetic layer FP1 may be provided by the magnetization fixing element 100. Accordingly, the same effect as an external magnetic field may be obtained without applying the external magnetic field. In other words, a magnetic moment of the magnetic layer FP1 may be precessed by applying a current without an external magnetic field.

An exchange coupling field between the fixed layer FF1 and the magnetic layer FP1 may be, for example, about 0.1 tesla (T) to about 0.5 tesla (T). In this regard, in order to break a SAF structure between the fixed layer FF1 and the magnetic layer FP1, a magnetic field of about 0.1 T to about 0.5 T may be needed. In other words, an effective field of the oscillator is about 0.1 T to about 0.5 T, and the oscillator may generate a frequency similar to that of an oscillator operated in a magnetic field of about 0.1 T to about 0.5 T. Accordingly, the oscillator according to example embodiments may oscillate a high frequency signal of about 10 GHz to about 50 GHz. When an exchange coupling field between the fixed layer FF1 and the magnetic layer FP1 is greater than 0.5 T, the oscillation frequency may be about 50 GHz or above.

Also, in the oscillator according to example embodiments, the intensity of an exchange coupling field varies according to an exchange coupling constant between the fixed layer FF1 and the magnetic layer FP1. Consequently, the oscillation frequency may be changed. The exchange coupling constant may vary according to a thickness of the separation layer S1, for example. Accordingly, the oscillation frequency may be easily adjusted by adjusting the thickness of the separation layer S1.

Figure 2:
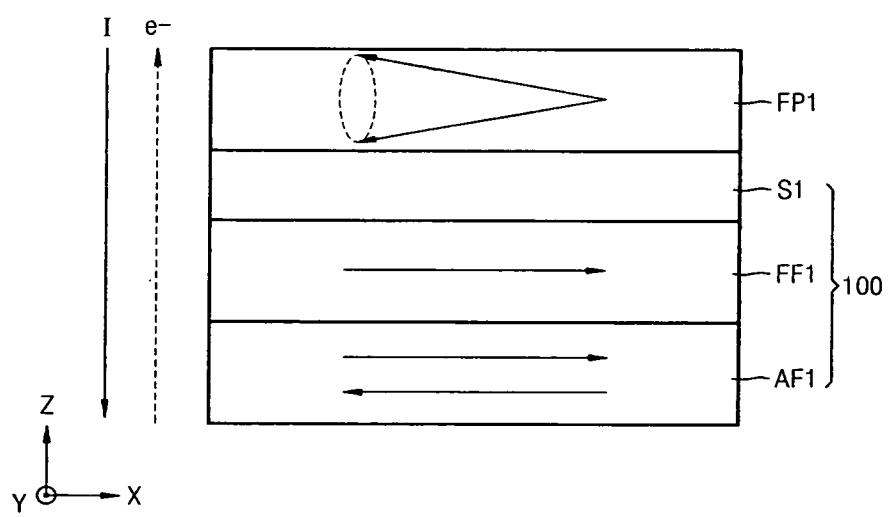
FIG. 2 is a cross-sectional view for explaining a method of operating the oscillator of FIG. 1.

FIG. 2 is a cross-sectional view for explaining a method of operating the oscillator of FIG. 1. FIG. 2 illustrates an example of precession of a magnetic moment of the magnetic layer FP1.

Referring to FIG. 2, a current I may be applied to the oscillator so as to induce a precession of a magnetic field of the magnetic layer FP1. The current I may be applied from the magnetic layer FP1 to the antiferromagnetic layer AF1. Due to the current I, electrons e-may flow from the antiferromagnetic layer AF1 to the magnetic layer FP1 through the fixed layer FF1. The electrons e-flowing to the magnetic layer FP1 through the fixed layer FF1 have the same spin direction as that of the fixed layer FF1 and may apply a spin torque to the magnetic layer FP1. Due to the spin torque, the magnetic moment of the magnetic layer FP1 may be perturbed. A restoring force due to the SAF structure is exerted in the magnetic layer FP1 so that a force for perturbation of the magnetic moment of the magnetic layer FP1 and a force to restore the magnetic moment are balanced. Thus, an axis of a magnetic moment may rotate while orbiting. As the magnetic moment is precessed, electrical resistance of the oscillator may be periodically changed. As such, a signal in a specific frequency band may be oscillated. In example embodiments, a spin transfer torque for precession of the magnetic layer FP1 may be induced from the magnetization fixing element 100, in particular from the fixed layer FF1. In other words, the magnetization fixing element 100 may fix the magnetization direction of the magnetic layer FP1 and apply a spin transfer torque to the magnetic layer FP1.

Figure 3:
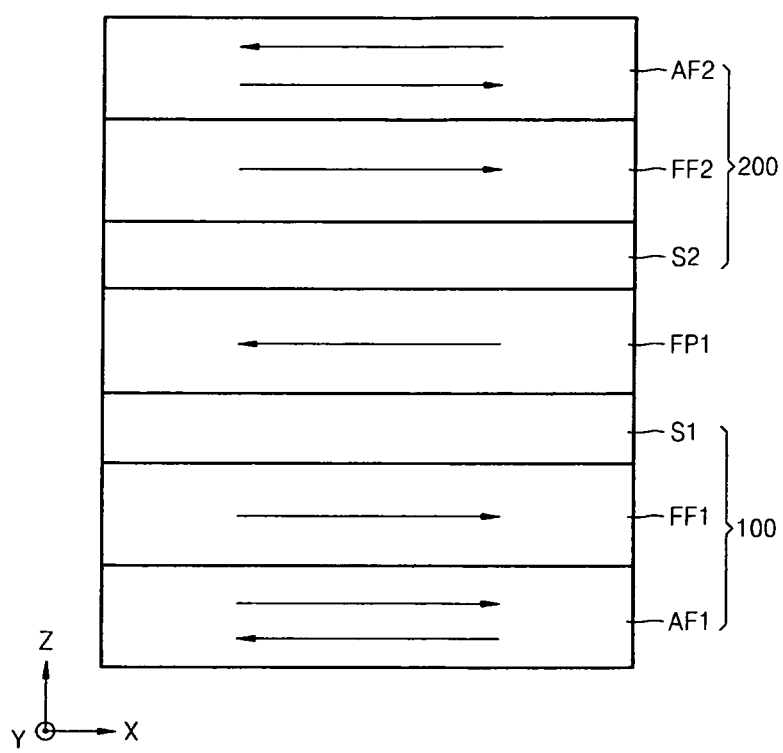
FIG. 3 is a cross-sectional view of an oscillator, according to example embodiments.

FIG. 3 is a cross-sectional view of an oscillator, according to example embodiments.

According to example embodiments, a spin transfer magnetic element configured to apply a spin transfer torque to the magnetic layer FP1 may be separately provided, as illustrated in FIG. 3.

Referring to FIG. 3, a magnetization fixing element 100 may be disposed on a first surface (e.g., a lower surface) of the magnetic layer FP1 and a spin transfer magnetic element 200 may be disposed on a second surface (e.g., an upper surface) of the magnetic layer FP1. The first and second surface may be opposing surfaces. The magnetization fixing element 100 may be the same as the magnetization fixing element 100 of FIG. 1. Hereinafter, the separation layer S1, the fixed layer FF1 and the antiferromagnetic layer AF1 included in the magnetization fixing element 100 of FIG. 3 are referred to as a first separation layer S1, a first fixed layer FF1, and a first antiferromagnetic layer AF1, respectively, for convenience of description. The spin transfer magnetic element 200 may include a second separation layer S2, a second fixed layer FF2 and a second antiferromagnetic layer AF2 that are sequentially formed in this order on the upper (or opposing) surface of the magnetic layer FP1. Due to the second antiferromagnetic layer AF2, a magnetization direction of the second fixed layer FF2 may be fixed in a set direction, (e.g., a direction opposite to the magnetization direction of the magnetic layer FP1 (X-axis direction)). The spin transfer magnetic element 200 (in particular, the second fixed layer FF2) may be an element for supplying a spin transfer torque to the magnetic layer FP1. The second fixed layer FF2 may not have a function to fix the magnetization direction of the magnetic layer FP1. The first fixed layer FF1 may fix a magnetization direction of the magnetic layer FP1; however, the second fixed layer FF2 may not fix the magnetization direction of the magnetic layer FP1. In this regard, a forming material and/or a thickness of the second separation layer S2 may be different from those of the first separation layer S1. For example, the second separation layer S2 may be an insulating layer (e.g., an MgO layer) or a conductive layer (e.g., a Cu layer). Even if the second separation layer S2 is formed of the same material as the first separation layer S1 (for example, Ru), a thickness of the second separation layer S2 may be different from a thickness of the first separation layer S1. As such, as the second separation layer S2 is formed differently from the first separation layer S1, an SAF coupling may not appear between the second fixed layer FF2 and the magnetic layer FP1.

As described above, the second fixed layer FF2, in which magnetization is fixed in a direction opposite to the magnetization direction of the magnetic layer FP1, may be an element for supplying a spin transfer torque to the magnetic layer FP1. Spin transfer from the second fixed layer FF2 to the magnetic layer FP1 through the second separation layer S2 may be easier than spin transfer from the first fixed layer FF1 to the magnetic layer FP1 through first separation layer S1. Accordingly, the oscillator having the structure of FIG. 3 may easily and stably oscillate a high frequency signal. Also, when the second separation layer S2 is an insulating layer (e.g., an MgO layer), a magnetoresistance (MR) ratio between the magnetic layer FP1 and the second fixed layer FF2 may be relatively greater than an MR ratio between the magnetic layer FP1 and the first fixed layer FF1. Accordingly, the oscillator having the structure as in FIG. 3 may have a high output power. In addition, similar to the structure of FIG. 1, an exchange coupling field between the first fixed layer FF1 and the magnetic layer FP1 may be adjusted so as to adjust the oscillation frequency in FIG. 3. For example, a thickness of the first separation layer S1 may be adjusted to adjust oscillation frequency.

Figure 4:
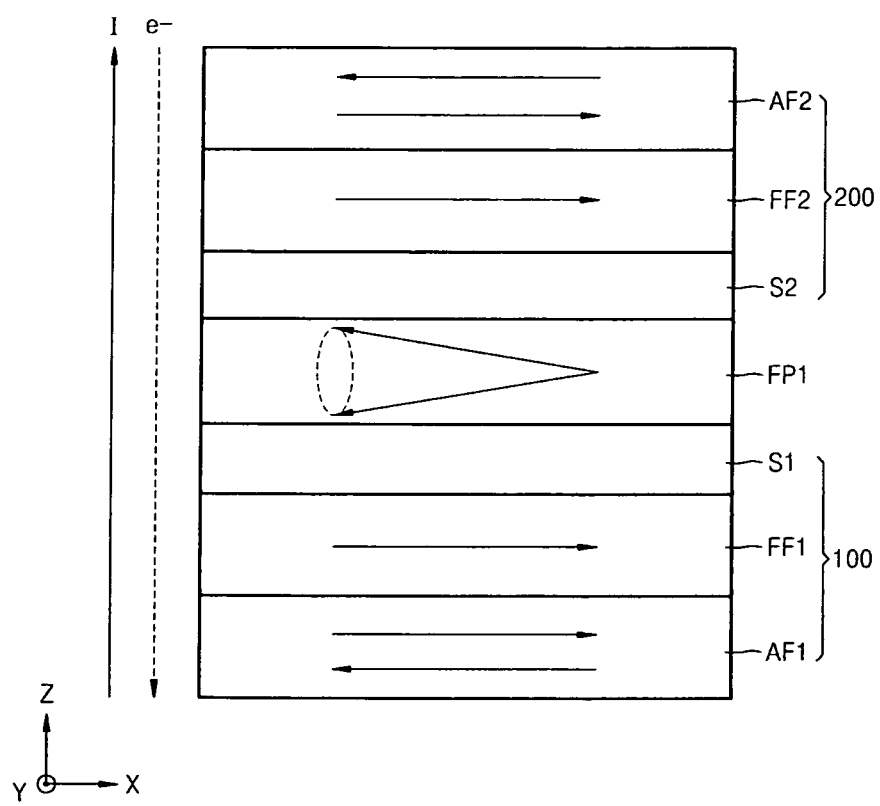
FIG. 4 is a cross-sectional view for explaining a method of operating the oscillator of FIG. 3.

FIG. 4 is a cross-sectional view for explaining a method of operating the oscillator of FIG. 3.

Referring to FIG. 4, a current I may be applied to the oscillator so as to induce a precession of a magnetic field of the magnetic layer FP1. The current I may be applied from the magnetization fixing element 100 to the spin transfer magnetic element 200. Due to the current I, electrons e-may flow from the spin transfer magnetic element 200 to the magnetization fixing element 100 through the magnetic layer FP1. The electrons e-flowing from the second fixed layer FF2 of the spin transfer magnetic element 200 to the magnetic layer FP1 has the same spin direction as that of the second fixed layer FF2 and may apply a spin torque to the magnetic layer FP1. Due to the spin torque, perturbation of a magnetic moment of the magnetic layer FP1 may occur. A restoring force due to the magnetization fixing element 100 is exerted in the magnetic layer FP1 so that a force for perturbation of a magnetic moment of the magnetic layer FP1 and a force to restore the magnetic moment are balanced. Thus, an axis of the magnetic moment may rotate while orbiting. As the magnetic moment is precessed, electrical resistance of the oscillator may be periodically changed, and consequently, a signal in a specific frequency band may be oscillated. In example embodiments, an element (e.g., the spin transfer magnetic element 200) configured to supply a spin transfer torque to the magnetic layer FP1 is separately provided from an element (e.g., the magnetization fixing element 100) configured to fix a magnetization direction of the magnetic layer FP1 (i.e., to provide the restoring force).

Figure 5:
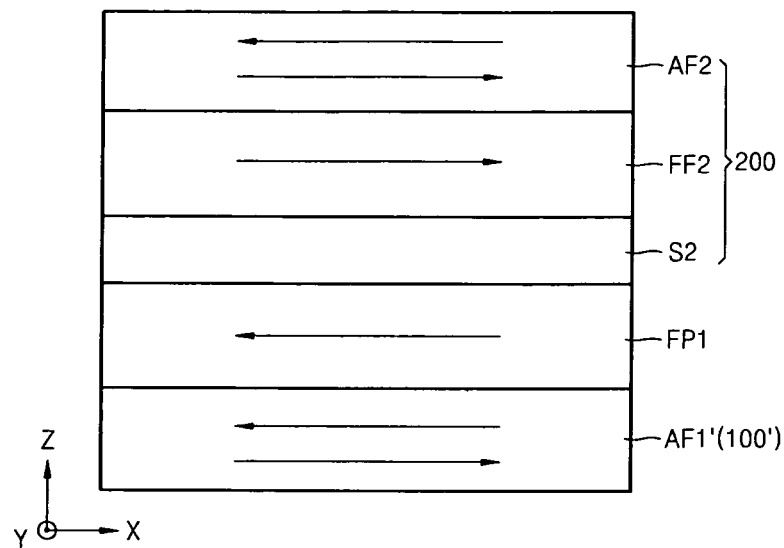
FIG. 5 is a cross-sectional view of an oscillator, according to example embodiments.

FIG. 5 is a cross-sectional view of an oscillator, according to example embodiments.

According to example embodiments, the structure of the magnetization fixing element 100 of FIGS. 1 and 3 may be changed. For example, as illustrated in FIG. 5, a magnetization fixing element 100' having a single-layered structure formed of an antiferromagnetic material may be used, instead of the magnetization fixing element 100 forming an SAF structure with the magnetic layer FP1.

Referring to FIG. 5, the magnetization fixing element 100,' which has a single-layered structure formed of an antiferromagnetic material, may be formed on the lower surface of the magnetic layer FP1. Hereinafter, the magnetization fixing element 100' is referred to as an antiferromagnetic layer AF1'. A magnetization direction of the magnetic layer FP1 may be fixed in a set direction (e.g., a reverse direction of an X-axis) due to the antiferromagnetic layer AF1'. A principle thereof is the same as the principle of fixing the magnetization direction of the fixed layer FF1 due to the antiferromagnetic layer AF1, as described above with reference to FIG. 1. As such, due to the antiferromagnetic layer AF1' directly contacting the magnetic layer FP1, a magnetization direction of the magnetic layer FP1 may be fixed. Thus, an effect as if an external magnetic field is applied to the magnetic layer FP1 may be obtained. A spin transfer magnetic element 200 may be formed on the magnetic layer FP1. The spin transfer magnetic element 200 may be the same as or similar to the spin transfer magnetic element 200 of FIG. 3.

When the antiferromagnetic layer AF1' is directly formed on the magnetic layer FP1 as illustrated in FIG. 5, the intensity of an effective field due to the antiferromagnetic layer AF1' may be high (that is, may be about several to several tens of tesla (T)). Such an effective field may be significantly larger than the effective field due to the SAF structure of FIGS. 1 and 3. Accordingly, the oscillator having the structure of FIG. 5 may oscillate a signal having a higher frequency than the oscillator of FIGS. 1 and 3. For example, the oscillator having the structure of FIG. 5 may generate a signal having a super high frequency of above 1 THz.

An exchange coupling constant between the magnetic layer FP1 and the antiferromagnetic layer AF1' (i.e., the magnetization fixing element 100') may be smaller than the exchange coupling constant between the second fixed layer FF2 and the second antiferromagnetic layer AF2. In other words, a force for fixing magnetization of the magnetic layer FP1 may be weaker than a force for fixing magnetization of the second fixed layer FF2. Accordingly, a magnetic moment of the magnetic layer FP1 may be precessed, instead of a magnetic moment of the second fixed layer FF2. For example, when the magnetic layer FP1 and the antiferromagnetic layer AF1' are formed of nickel iron (NiFe) and iridium manganese (IrMn), respectively, and the second fixed layer FF2 and the second antiferromagnetic layer AF2 are formed of cobalt iron boride (CoFeB) and IrMn, respectively, an exchange coupling constant between the magnetic layer FP1 and the antiferromagnetic layer AF1' may be smaller than the exchange coupling constant between the second fixed layer FF2 and the second antiferromagnetic layer AF2. Oscillation frequency may vary according to the exchange coupling constant between the magnetic layer FP1 and the antiferromagnetic layer AF1'. As described above, an exchange interaction between layers may vary according to materials used to form the magnetic layer FP1, the antiferromagnetic layer AF1', the second fixed layer FF2 and the second antiferromagnetic layer AF2 in FIG. 5. Thus, characteristics of the oscillator (for example, the frequency) may be adjusted by adjusting the materials.

Figure 6:
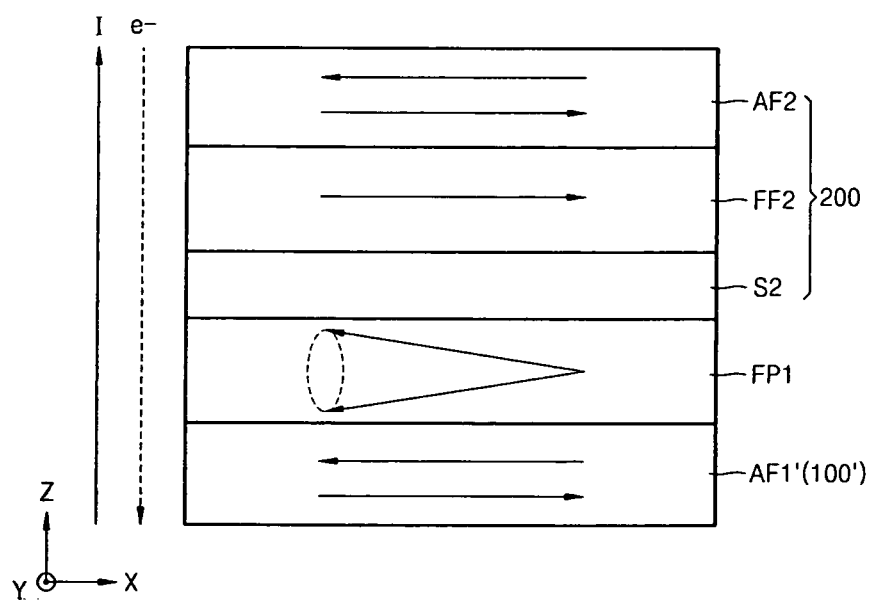
FIG. 6 is a cross-sectional view for explaining a method of operating the oscillator of FIG. 5.

FIG. 6 is a cross-sectional view for explaining a method of operating the oscillator of FIG. 5.

Referring to FIG. 6, a current I may be applied to the oscillator so as to induce a precession of a magnetic moment of the magnetic layer FP1. The current I may be applied from the magnetization fixing element 100' (i.e., the antiferromagnetic layer AF1') to the spin transfer magnetic element 200. Due to the current I, electrons e-may flow from the spin transfer magnetic element 200 to the magnetization fixing element 100' (i.e., the antiferromagnetic layer AF1') through the magnetic layer FP1. A precession principle due to the current I may be the same as described above with reference to FIG. 4 and thus a description thereof will not be repeated here. As the magnetic moment of the magnetic layer FP1 is precessed, electrical resistance of the oscillator may be periodically changed, and consequently, a signal in a specific frequency band may oscillate.

Figure 7:
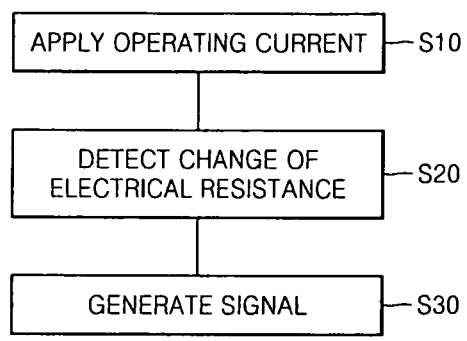
FIG. 7 is a flowchart illustrating a method of operating an oscillator, according to example embodiments.

FIG. 7 is a flowchart illustrating a method of operating an oscillator, according to example embodiments. FIG. 7 is described with reference to FIGS. 2, 4, and 6.

Referring to FIG. 7, a magnetic moment of the magnetic layer FP1 may be precessed (S10). A set current passing through the magnetic layer FP1 from one end to other end of the oscillator, or in an opposite direction, may be applied so as to precess the magnetic moment of the magnetic layer FP1. While the magnetic moment of the magnetic layer FP1 is precessed, a change in an electrical resistance of the oscillator may be detected (S20). Due to the precession, an electrical resistance of the oscillator may be periodically changed. A signal having a set frequency may be generated due to the change in the electrical resistance of the oscillator (S30). Thicknesses and materials of the layers included in the oscillator may be adjusted so as to adjust the oscillation frequency.

In the above example embodiments, the magnetic layer FP1, the first and second fixed layers FF1 and FF2, and the antiferromagnetic layers AF1, AF1', and AF2 having in-plane magnetic anisotropy are illustrated and described. However, example embodiments are not limited thereto. That is, when the magnetic layer FP1, the first and second fixed layers FF1 and FF2 and the antiferromagnetic layers AF1, AF1', and AF2 have perpendicular magnetic anisotropy, the idea and principle of example embodiments may be also applied. When perpendicular magnetic anisotropy materials are used, an orbit and direction of precession may vary. Also, in the above example embodiments, a magnetic moment of the magnetic layer FP1 formed of a ferromagnetic material (i.e., a ferromagnetic layer) is precessed. However, in some cases, it may be possible to induce a precession of a magnetic moment of an antiferromagnetic layer. For example, an oscillator having an antiferromagnetic layer/separation layer/fixed layer structure may be formed and a magnetic moment of at least a portion of the antiferromagnetic layer may be precessed, thereby generating a high-frequency signal. For example, the magnetic layer FP1 shown in FIG. 2 may include an antiferromagnetic material, and the antiferromagnetic layer AF1 may be omitted. The separation layer may not be included and/or a separate (or additional) antiferromagnetic layer may be further disposed on the fixed layer.

In addition, when a principle of the oscillators according to the above example embodiments is inversely applied, a radio frequency (RF) detector that converts a high-frequency signal into a direct current (DC) signal may be embodied. In other words, the structure of FIGS. 1, 3, and 5 may be applied to an RF detector, instead of an oscillator. It would have been obvious to one of ordinary skill in the art to form the RF detector by inversely applying a principle of the oscillator and thus a detailed description thereof will be omitted.

It should be understood that the example embodiments described herein should be considered in a descriptive sense only and not for purposes of limitation. For example, it would have been obvious to one of ordinary skill in the art to change the structures of FIGS. 1 through 6 and operating methods thereof in various ways. For example, other material layers may be further included between layers included in the oscillator or on at least one of an upper surface and lower surface of the oscillator. Also, an operating current may be applied between one end of the oscillator and the magnetic layer FP1, instead of both ends of the oscillator. While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An oscillator, comprising:
a magnetic layer; and
a magnetization fixing element configured to fix a magnetization direction of the magnetic layer,
wherein the oscillator is configured to generate a signal by using precession of a magnetic moment of the magnetic layer,
wherein the magnetic fixing element has one of a first structure and a second structure,
wherein the first structure includes a first separation layer, a first fixed layer, and a first antiferromagnetic layer sequentially formed on a surface of the magnetic layer,
wherein the magnetic layer and the magnetic fixing element having the first structure form a synthetic antiferromagnet (SAF) structure such that the magnetic layer is included in the SAF structure, wherein the first fixed layer is configured to fix the magnetization direction of the magnetic layer, wherein the second structure includes a second antiferromagnetic layer directly contacting a surface of the magnetic layer, and wherein the second antiferromagnetic layer is configured to fix the magnetization direction of the magnetic layer.

2. The oscillator of claim 1, wherein the magnetic layer includes a ferromagnetic material.

3. The oscillator of claim 1, wherein the magnetization fixing element is configured to induce a spin transfer torque for the precession.

4. The oscillator of claim 1, further comprising a spin transfer magnetic element configured to induce a spin transfer torque for the precession.

5. The oscillator of claim 4, wherein the magnetization fixing element is on a first surface of the magnetic layer, and the spin transfer magnetic element includes a second separation layer, a second fixed layer, and a third antiferromagnetic layer that are sequentially formed in this order on a second surface of the magnetic layer, the second fixing layer being magnetized in a direction that is different from the magnetization direction of the magnetic layer.

6. The oscillator of claim 5, wherein the magnetization fixing element includes a first separation layer, and the second separation layer is formed of a material that is different from that of the first separation layer.

7. The oscillator of claim 5, wherein the second separation layer includes an insulating layer or a conductive layer.

8. The oscillator of claim 5, wherein an exchange coupling constant between the magnetic layer and the magnetization fixing element is smaller than an exchange coupling constant between the second fixed layer and the third antiferromagnetic layer.

9. The oscillator of claim 1, wherein an oscillation frequency of the oscillator is adjusted according to an exchange coupling constant between the magnetic layer and the magnetization fixing element.

10. A method of operating an oscillator including a magnetic layer and a magnetization fixing element configured to fix a magnetization direction of the magnetic layer, the method comprising:

inducing a precession of a magnetic moment of the magnetic layer; and detecting a resistance change of the oscillator due to the precession, wherein the magnetic fixing element has one of a first structure and a second structure, the first structure includes a first separation layer, a first fixed layer, and a first antiferromagnetic layer sequentially formed on a surface of the magnetic layer, the magnetic layer and the magnetic fixing element having the first structure form a synthetic antiferromagnet (SAF) structure such that the magnetic layer is included in the SAF structure, the first fixed layer is configured to fix the magnetization direction of the magnetic layer, the second structure includes a second antiferromagnetic layer directly contacting a surface of the magnetic layer, and the second antiferromagnetic layer is configured to fix the magnetization direction of the magnetic layer.

11. The method of claim 10, wherein inducing the precession includes applying a current to the oscillator.

12. The method of claim 10, wherein the magnetic layer includes a ferromagnetic material.

13. The method of claim 10, wherein the oscillator further includes a spin transfer magnetic element configured to apply a spin transfer torque to the magnetic layer, and inducing the precession includes applying a current to the spin transfer magnetic element from the magnetic layer.

14. The method of claim 13, wherein the magnetization fixing element is disposed on a first surface of the magnetic layer, and the spin transfer magnetic element includes a second separation layer, a second fixed layer and a third antiferromagnetic layer that are sequentially formed in this order on a second surface of the magnetic layer, the second fixing layer being magnetized in a direction that is different from the magnetization direction of the magnetic layer.

15. The oscillator of claim 1, wherein the magnetization fixing element includes a material having antiferromagnetic characteristics.

16. The method of claim 10, wherein the magnetization fixing element includes a material having antiferromagnetic characteristics.

* * * * *